（12）United States Patent
Fujii et al.

(10) Patent No.: US 10,332,966 B2
(45) Date of Patent: Jun. 25, 2019

(54) SEMICONDUCTOR DEVICE, METHOD OF MANUFACTURING THE SAME AND POWER CONVERTER

(71) Applicant: TOYODA GOSEI CO., LTD., Kiyosu-shi (JP)

(72) Inventors: Takahiro Fujii, Kiyosu (JP); Takaki Niwa, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 273 days.

(21) Appl. No.: 15/240,899

(22) Filed: Aug. 18, 2016

(65) Prior Publication Data
US 2017/0077830 A1 Mar. 16, 2017

(30) Foreign Application Priority Data
Sep. 10, 2015 (JP) ................................. 2015-178200

(51) Int. Cl.
*H01L 29/20* (2006.01)
*H01L 21/324* (2006.01)
(Continued)

(52) U.S. Cl.
CPC .... *H01L 29/2003* (2013.01); *H01L 21/26553* (2013.01); *H01L 21/3245* (2013.01);
(Continued)

(58) Field of Classification Search
CPC ............. H01L 29/2003; H01L 29/0661; H01L 29/0619; H01L 29/872; H01L 29/66212;
(Continued)

(56) References Cited

U.S. PATENT DOCUMENTS 4,615,766 A * 10/1986 Jackson ................ H01L 21/314
148/DIG. 84
6,335,218 B1 1/2002 Ota et al.
(Continued)

FOREIGN PATENT DOCUMENTS

JP 2000-323751 A 11/2000
JP 2009-170604 A 7/2009
(Continued)

OTHER PUBLICATIONS

Japanese Office Action dated Jun. 12, 2018 in corresponding Japanese Application No. 2015-178200 with an English translation thereof.

*Primary Examiner* — Eduardo A Rodela
*Assistant Examiner* — Nilufa Rahim
(74) *Attorney, Agent, or Firm* — McGinn I.P. Law Group, PLLC.

(57) ABSTRACT

There is provided a method of manufacturing a semiconductor device. The method of manufacturing the semiconductor device comprises a process of forming a semiconductor layer that is mainly made of a group III nitride and has n-type characteristics, by crystal growth; a film formation process of forming a through film that is mainly made of an element different from an element serving as an n-type impurity relative to the group III nitride, by growth on the semiconductor layer continuous with crystal growth of the semiconductor layer; an ion implantation process of implanting a p-type impurity into the semiconductor layer across the through film by ion implantation; a heating process of heating the semiconductor layer and the through film after completion of the ion implantation process, so as to activate a region of the semiconductor layer in which the p-type impurity is ion-implanted, to a p-type semiconductor region; and a removal process of removing the through film from the semiconductor layer, after completion of the heat-
(Continued)

ing process. This configuration improves the surface morphology of the p-type semiconductor region formed by ion implantation.

15 Claims, 14 Drawing Sheets

(51) Int. Cl.
*H01L 29/66* (2006.01)
*H01L 29/872* (2006.01)
*H01L 29/06* (2006.01)
*H01L 21/265* (2006.01)
*H02M 1/42* (2007.01)

(52) U.S. Cl.
CPC ...... *H01L 29/0619* (2013.01); *H01L 29/0661* (2013.01); *H01L 29/66212* (2013.01); *H01L 29/872* (2013.01); *H02M 1/4233* (2013.01); *Y02B 70/126* (2013.01)

(58) Field of Classification Search
CPC ........... H01L 21/0254; H01L 21/26553; H01L 21/3245; H01L 21/26546; Y02B 70/126; H02M 1/4233
See application file for complete search history.

(56) References Cited

U.S. PATENT DOCUMENTS

| | | |
|---|---|---|
| 2014/0054680 A1 | 2/2014 | Hashimoto et al. |
| 2015/0011080 A1 | 1/2015 | Agraffeil |
| 2015/0380498 A1 | 12/2015 | Tanaka et al. |
| 2016/0240584 A1* | 8/2016 | El-Hanany ........ H01L 27/14696 |

FOREIGN PATENT DOCUMENTS

| | | |
|---|---|---|
| JP | 2014-041917 A | 3/2014 |
| JP | 2014-225506 A | 12/2014 |
| JP | 2015-015467 A | 1/2015 |
| WO | WO 2015-029578 A1 | 3/2015 |

* cited by examiner

<p-TYPE SEMICONDUCTOR REGION BY EPITAXIAL GROWTH>

SEMICONDUCTOR DEVICE, METHOD OF MANUFACTURING THE SAME AND POWER CONVERTER

CROSS-REFERENCE TO RELATED APPLICATION

The present application claims priority from Japanese patent application No. 2015-178200 filed on Sep. 10, 2015, the entirety of disclosures of which is hereby incorporated by reference into this application.

BACKGROUND

Technical Field

The present invention relates to a semiconductor device, a method of manufacturing the same and a power converter.

Related Art

A known configuration of a semiconductor device (semiconductor element) includes a semiconductor layer formed from a group III nitride such as gallium nitride (GaN). JP 2014-41917A describes a technique that forms a group III nitride-based p-type semiconductor by ion implantation. The technique described in JP 2014-41917A directly implants a p-type impurity into a semiconductor layer by ion implantation, so as to form a p-type semiconductor in a region of the semiconductor layer in which the p-type impurity is ion-implanted.

In the technique disclosed in JP 2014-41917A, heat treatment for activating the region of the semiconductor layer in which the p-type impurity is ion-implanted causes deterioration of the surface morphology of this region. Deterioration of the surface morphology is likely to cause deterioration of the device characteristics of the semiconductor device and is likely to reduce the crystallinity of the semiconductor layer formed in this region by regrowth. There is accordingly a demand for a technique that improves the surface morphology of a p-type semiconductor region formed by ion implantation.

The reason of deterioration of the surface morphology by the technique disclosed in JP 2014-41917A may be attributed to that an n-type impurity (for example, silicon atom (Si)) adhering to the surface of the semiconductor layer enters lattice points of a group III atom (for example, lattice points of gallium atom (Ga) in gallium nitride (GaN)) where an ion-implanted p-type impurity (for example, magnesium atom (Mg)) is supposed to enter. The p-type impurity failing to enter the lattice points of the group III atom by the presence of the n-type impurity deposits on the surface of the semiconductor layer to form droplets (precipitate). The droplets of the p-type impurity causes deterioration of the surface morphology.

SUMMARY

In order to solve at least part the problems described above, the invention may be implemented by aspects described below.

(1) According to one aspect of the invention, there is provided a method of manufacturing a semiconductor device. This method of manufacturing the semiconductor device may comprise forming a semiconductor layer that is mainly made of a group III nitride and has n-type characteristics, by crystal growth; a film formation process of forming a through film that is mainly made of an element different from an element serving as an n-type impurity relative to the group III nitride, by growth on the semiconductor layer continuous with crystal growth of the semiconductor layer; an ion implantation process of implanting a p-type impurity into the semiconductor layer across the through film by ion implantation; a heating process of heating the semiconductor layer and the through film after completion of the ion implantation process, so as to activate a region of the semiconductor layer in which the p-type impurity is ion-implanted, to a p-type semiconductor region; and a removal process of removing the through film from the semiconductor layer, after completion of the heating process. In the manufacturing method of this aspect, the through film serves to suppress adhesion of the n-type impurity on the surface of the semiconductor layer and thereby suppresses the n-type impurity adhering to the surface of the semiconductor layer from being knocked-on and diffused into the semiconductor layer in the ion implantation process. This accelerates displacement of the group III atom by the p-type impurity in the semiconductor layer and thereby suppresses deposition of the p-type impurity on the surface of the semiconductor layer. This configuration accordingly improves the surface morphology of the p-type semiconductor region formed by ion implantation. This results in improving the device characteristics of the semiconductor device.

(2) In the method of manufacturing the semiconductor device of the above aspect, the through film may be mainly made of at least one amorphous component selected from the group consisting of aluminum nitride (AlN), gallium nitride (GaN), indium nitride (InN), aluminum gallium nitride (AlGaN), gallium indium nitride (GaInN), aluminum indium nitride (AlInN) and aluminum gallium indium nitride (AlGaInN). This aspect enables the through film to be readily provided.

(3) In the method of manufacturing the semiconductor device of the above aspect, the film formation process may cause a growth of the through film at temperature of between 300° C. and 1500° C., inclusive. This aspect enables the through film to be readily formed.

(4) In the method of manufacturing the semiconductor device of the above aspect, the film formation process may cause a growth of the through film under pressure of between 10 kPa and 100 kPa, inclusive. This aspect enables the through film to be readily formed.

(5) In the method of manufacturing the semiconductor device of the above aspect, the ion implantation process may implant at least one of magnesium atom (Mg) and beryllium atom (Be) as the p-type impurity into the semiconductor layer across the through film by ion implantation. This aspect enables the p-type semiconductor region to be readily formed by ion implantation.

(6) In the method of manufacturing the semiconductor device of the above aspect, the ion implantation process may implant the p-type impurity into the semiconductor layer across the through film by ion implantation at temperature of between 20° C. and 500° C., inclusive. This aspect facilitates ion implantation of the p-type impurity into the semiconductor layer.

(7) In the method of manufacturing the semiconductor device of the above aspect, the heating process may heat the semiconductor layer and the through film at temperature of between 800° C. and 1500° C., inclusive. This aspect readily activates the p-type impurity ion-implanted into the semiconductor layer.

(8) In the method of manufacturing the semiconductor device of the above aspect, the heating process may heat the semiconductor layer and the through film under pressure of between 10 kPa and 100 kPa, inclusive. This aspect readily activates the p-type impurity ion-implanted into the semiconductor layer.

(9) In the method of manufacturing the semiconductor device of the above aspect, the through film may be mainly made of a nitride of the element different from the element serving as the n-type impurity relative to the group III nitride, and the heating process may heat the semiconductor layer and the through film in an atmosphere gas containing ammonia ($NH_3$). In the manufacturing method of this aspect, the nitrogen component included in ammonia of the atmosphere gas serves to suppress deterioration of the through film by dropping off the nitrogen component in the heating process.

(10) In the method of manufacturing the semiconductor device of the above aspect, the heating process may heat the semiconductor layer and the through film for a treatment time of between 1 minute and 60 minutes, inclusive. This aspect sufficiently activates the p-type impurity ion-implanted into the semiconductor layer.

(11) In the method of manufacturing the semiconductor device of the above aspect, the removal process may remove the through film from the semiconductor layer using a stripping solution having pH of not lower than 12. This aspect enables the through film to be readily removed from the semiconductor layer.

(12) In the method of manufacturing the semiconductor device of the above aspect, the removal process may remove the through film from the semiconductor layer using a stripping solution at temperature of between 50° C. and 120° C., inclusive. This aspect enables the through film to be readily removed from the semiconductor layer.

(13) In the method of manufacturing the semiconductor device of the above aspect, the removal process may soak the semiconductor device in a stripping solution for a treatment time of between 1 minute and 60 minutes inclusive to remove the through film from the semiconductor layer. This aspect enables the through film to be sufficiently removed from the semiconductor layer.

(14) The method of manufacturing the semiconductor device of the above aspect may further comprise forming a protective film on the through film, after completion of the ion implantation process and prior to the heating process. In the manufacturing method of this aspect, the protective film serves to suppress deterioration of the through film by dropping off the nitrogen component in the heating process.

(15) According to another aspect of the invention, there is provided a semiconductor device. This semiconductor device may comprise an n-type semiconductor region that is mainly made of a group III nitride; and a p-type semiconductor region that is mainly made of a group III nitride, contains a p-type impurity, is adjacent to the n-type semiconductor region and has a surface continuously spread to the n-type semiconductor region. Concentration of oxygen atom (O) included in the p-type semiconductor region and concentration of silicon atom (Si) included in the p-type semiconductor region may gradually decrease with an increase in depth in the p-type semiconductor region from the surface. Concentration of hydrogen atom (H) included in the p-type semiconductor region may gradually increase and then gradually decrease with an increase in depth in the p-type semiconductor region from the surface. Concentration of the p-type impurity included in the p-type semiconductor region may start gradually decreasing with an increase in depth in the p-type semiconductor region from a location where the concentration of hydrogen atom (H) starts gradually decreasing. The semiconductor device of this aspect improves the surface morphology of the p-type semiconductor region. This results in improving the device characteristics of the semiconductor device.

(16) In the semiconductor device of the above aspect, the concentration of hydrogen atom (H) in the p-type semiconductor region may be equal to or higher than $1 \times 10^{17}$ $cm^{-3}$. This aspect sufficiently ensures the p-type characteristics of the p-type semiconductor region.

(17) In the semiconductor device of the above aspect, the concentration of the p-type impurity in the p-type semiconductor region may be equal to or higher than $1 \times 10^{18}$ $cm^{-3}$. This aspect sufficiently ensures the p-type characteristics of the p-type semiconductor region.

The invention may be implemented by any of various aspects other than the semiconductor device and the method of manufacturing the semiconductor device of the above aspects, for example, a power converter including the semiconductor device of any of the above aspects and a manufacturing apparatus that is configured to implement the method of manufacturing the semiconductor device of any of the above aspects.

The above aspects of the invention improve the surface morphology of the p-type semiconductor region formed by ion implantation. This results in improving the device characteristics of the semiconductor device.

DESCRIPTION OF EMBODIMENTS

A. First Embodiment

A-1. Method of Manufacturing Semiconductor Device

Figure 1:
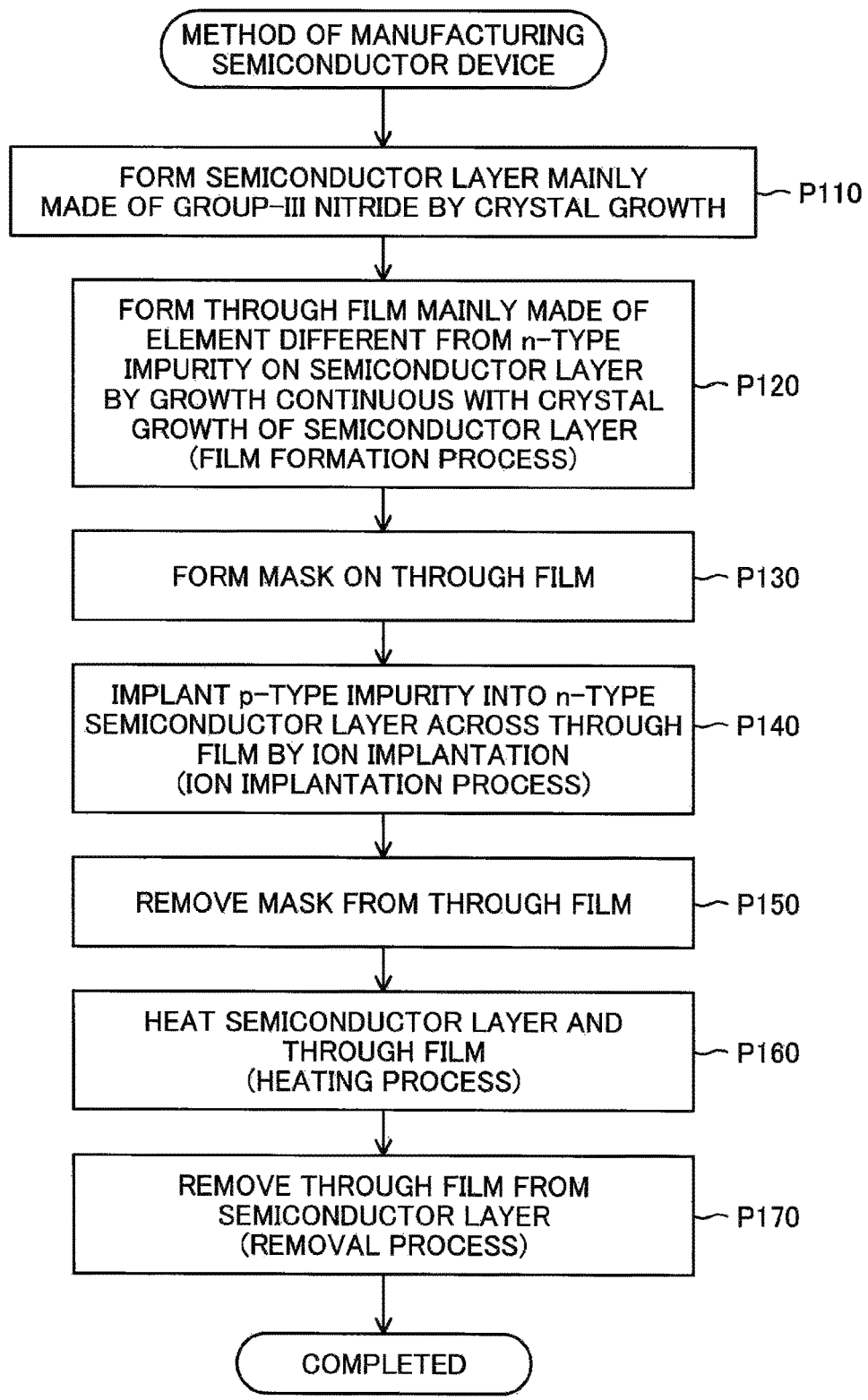
FIG. 1 is a process chart showing a method of manufacturing a semiconductor device.

FIG. 1 is a process chart showing a method of manufacturing a semiconductor device. FIGS. 2 to 8 are diagrams schematically illustrating processes of manufacturing the semiconductor device.

Figure 2:
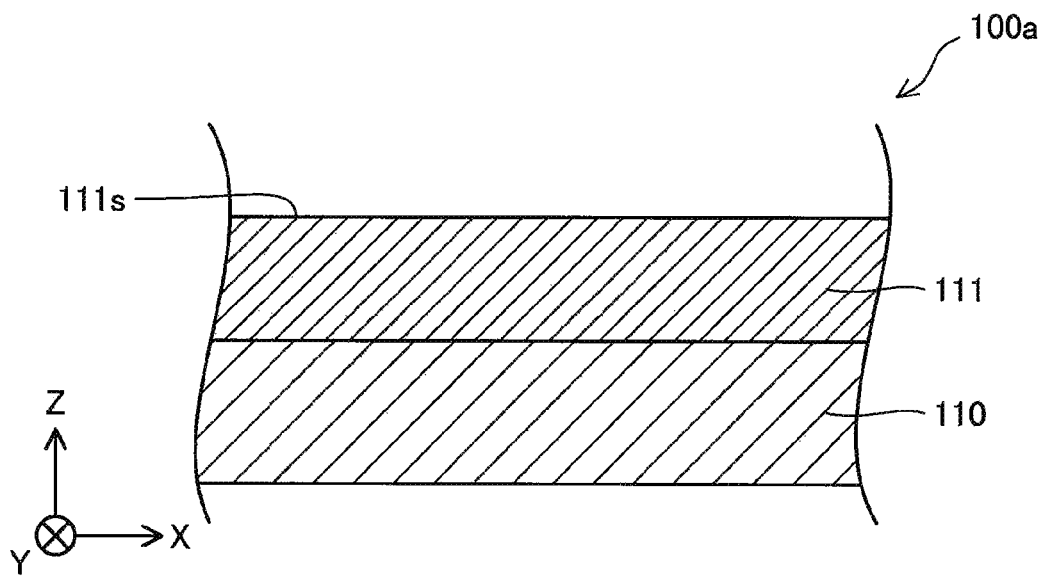
FIG. 2 is a diagram schematically illustrating a process of manufacturing the semiconductor device.

XYZ axes orthogonal to one another are illustrated in FIG. 2. Among the XYZ axes of FIG. 2, the X axis denotes a left-right axis on the sheet surface of FIG. 2. +X-axis direction denotes a rightward direction on the sheet surface, and −X-axis direction denotes a leftward direction on the sheet surface. Among the XYZ axes of FIG. 2, the Y axis denotes a front-back axis on the sheet surface of FIG. 2. +Y-axis direction denotes a backward direction on the sheet surface, and −Y-axis direction denotes a forward direction on the sheet surface. Among the XYZ axes of FIG. 2, the Z axis denotes a top-bottom axis on the sheet surface of FIG. 2. +Z-axis direction denotes an upward direction on the sheet surface, and −Z-axis direction denotes a downward direction on the sheet surface. The XYZ axes illustrated in other drawings correspond to the XYZ axes of FIG. 2.

The manufacturer first forms a semiconductor layer 111 that is mainly made of a group III nitride and has n-type characteristics on a substrate 110 by epitaxial growth (crystal growth) (process P110, FIG. 2). The manufacturer accordingly obtains a semiconductor device 100a with the semiconductor layer 111 formed on the substrate 110 as a half-finished semiconductor device in the course of manufacture. In the description hereof, the expression of "mainly made of a group III nitride" means containing a group III nitride at 90% or higher molar fraction.

According to this embodiment, the manufacturer forms the semiconductor layer 111 on the +Z-axis direction side surface of the substrate 110. According to this embodiment, the manufacturer forms the semiconductor layer 111 by metal organic chemical vapor deposition (MOCVD).

The substrate 110 of the semiconductor device 100a is a plate-like semiconductor extended along the X axis and the Y axis. According to this embodiment, the substrate 110 is mainly made of gallium nitride (GaN) that is one group III nitride. According to this embodiment, the substrate 110 is an n-type semiconductor containing silicon (Si) as the donor element. According to this embodiment, the average concentration of silicon (Si) contained in the substrate 110 is about $1.0 \times 10^{18}$ cm$^{-3}$.

The semiconductor layer 111 of the semiconductor device 100a is an n-type semiconductor layer mainly made of a group III nitride. According to this embodiment, the semiconductor layer 111 is located on the +Z-axis direction side of the substrate 110 and is extended along the X axis and the Y axis. The semiconductor layer 111 has a continuously spread surface 111s. According to this embodiment, the surface 111s is a plane facing the +Z-axis direction. According to this embodiment, the semiconductor layer 111 is mainly made of gallium nitride (GaN) that is one group III nitride. According to this embodiment, the semiconductor layer 111 contains silicon (Si) as the donor element (n-type impurity, n-type dopant element). According to this embodiment, the average concentration of silicon (Si) contained in the semiconductor layer 111 is about $1.0 \times 10^{16}$ cm$^{-3}$.

Figure 3:
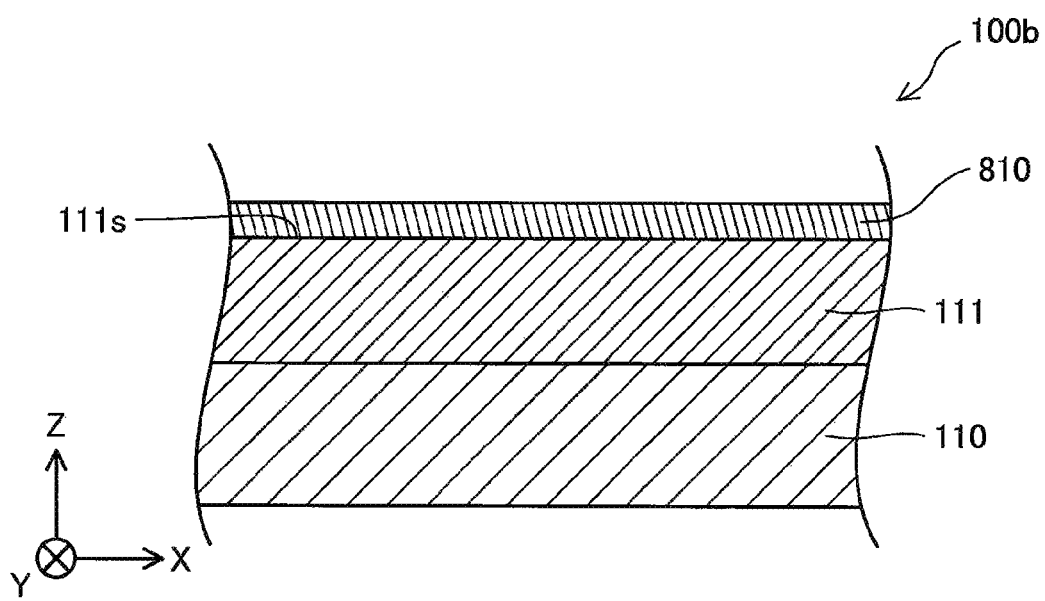
FIG. 3 is a diagram schematically illustrating a process of manufacturing the semiconductor device.

After forming the semiconductor layer 111, the manufacturer performs a film formation process (process P120, FIG. 3). In the film formation process (process P120), the manufacturer forms a through film that is mainly made of an element different from the n-type impurity by growth on the semiconductor layer 111 continuous with the crystal growth of the semiconductor layer 111. The manufacturer accordingly obtains a semiconductor device 100b with the through film 810 formed on the surface 111s of the semiconductor layer 111 as a half-finished semiconductor device in the course of manufacture.

According to this embodiment, in the film formation process (process P120), the manufacturer forms a through film 810 by metal organic chemical vapor deposition (MOCVD) in the reaction chamber where the semiconductor layer 111 is formed, subsequent to formation of the semiconductor layer 111. This protects the surface 111s of the semiconductor layer 111 from being contaminated with impurity.

According to this embodiment, in the film formation process (process P120), the manufacturer causes a growth of the through film 810 at temperature of between 300° C. and 1500° C., inclusive. This enables the through film 810 to be readily formed.

According to this embodiment, in the film formation process (process P120), the manufacturer causes a growth of the through film 810 under a pressure of between 10 kPa and 100 kPa, inclusive. This enables the through film 810 to be readily formed.

The through film 810 serves as a dummy layer configured to adjust the concentration of impurity ion-implanted into the semiconductor layer 111. According to this embodiment, the through film 810 has thickness (length in the Z-axis direction) of 30 nm (nanometer)

According to this embodiment, the through film 810 is a film of a group III nitride mainly made of an element different from the n-type impurity. The through film 810 may be mainly made of at least one amorphous component selected from the group consisting of aluminum nitride (AlN), gallium nitride (GaN), indium nitride (InN), aluminum gallium nitride (AlGaN), gallium indium nitride (GaInN), aluminum indium nitride (AlInN) and aluminum gallium indium nitride (AlGaInN). This enables the through film 810 to be readily provided. According to this embodiment, the through film 810 is mainly made of an amorphous component of aluminum nitride (AlN).

Figure 4:
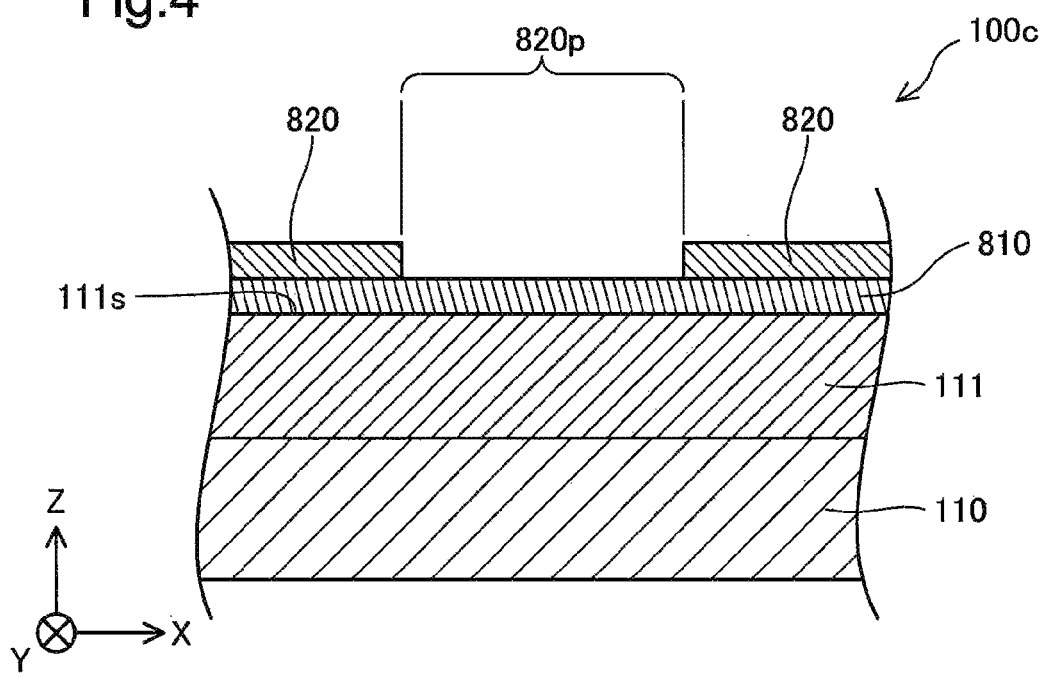
FIG. 4 is a diagram schematically illustrating a process of manufacturing the semiconductor device.

After completion of the film formation process (process P120), the manufacturer forms a mask 820 on the through film 810 (process P130, FIG. 4). The manufacturer accordingly obtains a semiconductor device 100c with the mask 820 formed on the through film 810 as a half-finished semiconductor device in the course of manufacture. The mask 820 has an opening 820p to make a region for ion implantation in the semiconductor layer 111 exposed. According to this embodiment, the mask 820 is mainly made of a photoresist. According to another embodiment, the mask 820 may be an insulating film (mainly made of, for example, silicon dioxide (SiO$_2$) or silicon nitride (SiNx)).

Figure 5:
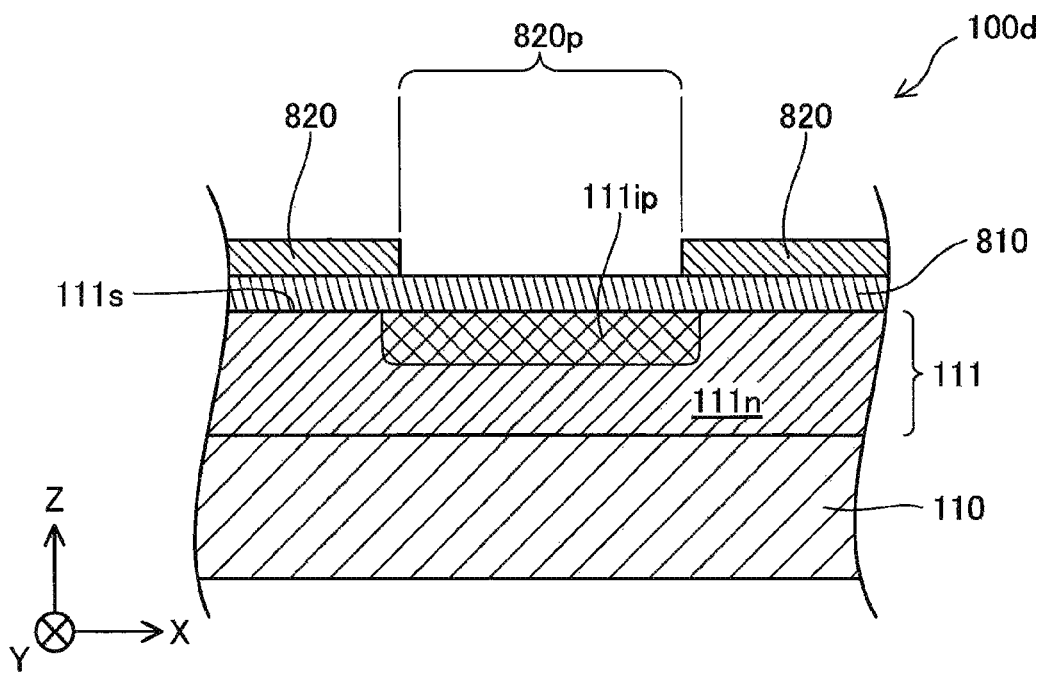
FIG. 5 is a diagram schematically illustrating a process of manufacturing the semiconductor device.

After forming the mask 820 (process P130), the manufacturer performs an ion implantation process (process P140, FIG. 5). In the ion implantation process (process P140), the manufacturer implants a p-type impurity by ion implantation into the semiconductor layer 111 across the through film 810. The manufacturer accordingly obtains a semiconductor device 100d with the ion-implanted semiconductor layer 111 as a half-finished semiconductor device in the course of manufacture. The semiconductor layer 111 of the semiconductor device 100d includes an n-type semiconductor region 111n that is not affected by ion implantation and an ion-implanted region 111ip that is affected by ion implantation.

The ion implantation process (process P140) may implant at least one of magnesium atom (Mg) and beryllium atom (Be) as the p-type impurity into the semiconductor layer 111 across the through film 810. This enables a p-type semiconductor region 111p which is obtained by activation in a later process to be readily formed by ion implantation. According to this embodiment, the manufacturer ion-implants magnesium atom (Mg) as the p-type impurity.

According to this embodiment, in the ion implantation process (process P140), the manufacturer implants the p-type impurity into the semiconductor layer 111 across the through film 810 by ion implantation at temperature of between 20° C. and 500° C., inclusive. This facilitates ion implantation of the p-type impurity into the semiconductor layer 111.

In the ion implantation process (process P140), the p-type impurity is transmitted from the opening 820p of the mask 820 through the through film 810 to be implanted from the surface 111s into the inner side of the semiconductor layer 111. This forms the ion-implanted region 111ip in which the p-type impurity is distributed, in the semiconductor layer 111. The p-type impurity in the ion-implanted region 111ip is not arranged on a crystal lattice. Accordingly the ion-implanted region 111ip does not have the p-type characteristics.

Figure 6:
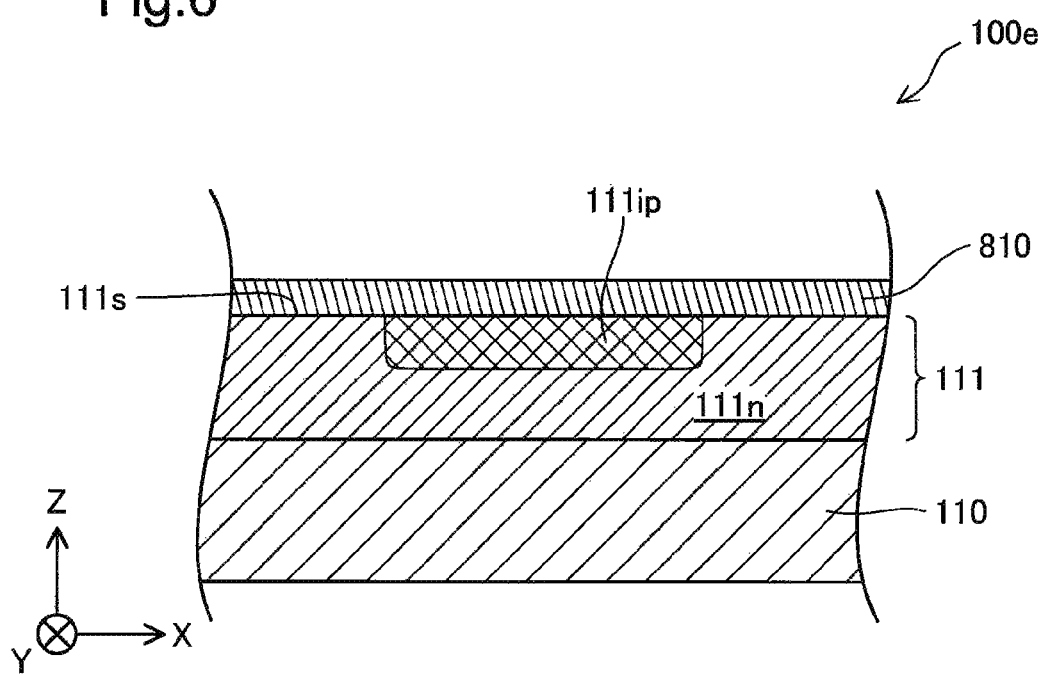
FIG. 6 is a diagram schematically illustrating a process of manufacturing the semiconductor device.

After completion of the ion implantation process (process P140), the manufacturer removes the mask 820 from the through film 810 (process P150, FIG. 6). The manufacturer accordingly obtains a semiconductor device 100e by removal of the mask 820 from the semiconductor device 100d as a half-finished semiconductor device in the course of manufacture. According to this embodiment, the manufacturer removes the mask 820 mainly made of the photoresist using an organic solvent. According to another embodiment, when an insulating film mainly made of silicon dioxide ($SiO_2$) is used as the mask 820, the manufacturer may remove the mask 820 using hydrogen fluoride or may remove the mask 820 using a mixed aqueous solution of ammonium hydrogen fluoride and ammonium fluoride.

Figure 7:
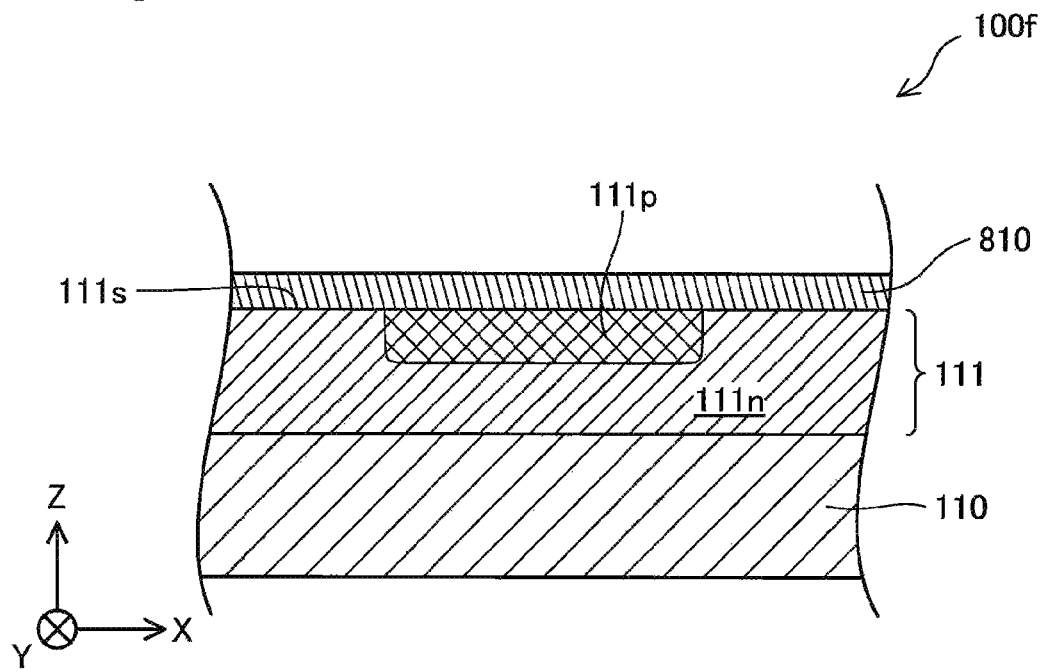
FIG. 7 is a diagram schematically illustrating a process of manufacturing the semiconductor device.

After removal of the mask 820 (process P150), the manufacturer performs a heating process (process P160, FIG. 7). In the heating process (process P160), the manufacturer heats the semiconductor layer 111 and the through film 810 to activate the ion-implanted region 111ip. This changes the ion-implanted region 111ip to a p-type semiconductor region 111p having the p-type characteristics. The manufacturer accordingly obtains a semiconductor device 100f including the p-type semiconductor region 111p as a half-finished semiconductor device in the course of manufacture.

According to this embodiment, in the heating process (process P160), the manufacturer heats the semiconductor layer 111 and the through film 810 at temperature of between 800° C. and 1500° C., inclusive. This readily activates the p-type impurity ion-implanted into the semiconductor layer 111.

According to this embodiment, in the heating process (process P160), the manufacturer heats the semiconductor layer 111 and the through film 810 under pressure of between 10 kPa and 100 kPa, inclusive. This readily activates the p-type impurity ion-implanted into the semiconductor layer 111.

According to this embodiment, in the heating process (process P160), the manufacturer heats the semiconductor layer 111 and the through film 810 in an atmosphere gas containing ammonia ($NH_3$). The nitrogen component included in ammonia ($NH_3$) of the atmosphere gas serves to suppress deterioration of the through film 810 by dropping off the nitrogen component in the heating process (process P160).

According to this embodiment, in the heating process (process P160), the manufacturer heats the semiconductor layer 111 and the through film 810 for a treatment time of between 1 minute and 60 minutes, inclusive. This enables the p-type impurity ion-implanted into the semiconductor layer 111 to be sufficiently activated.

According to another embodiment, after completion of the ion implantation process (process P140), a protective film may be formed on the through film 810, prior to the heating process (process P160). The protective film serves to suppress deterioration of the through film 810 by dropping off the nitrogen component in the heating process (process P160).

Figure 8:
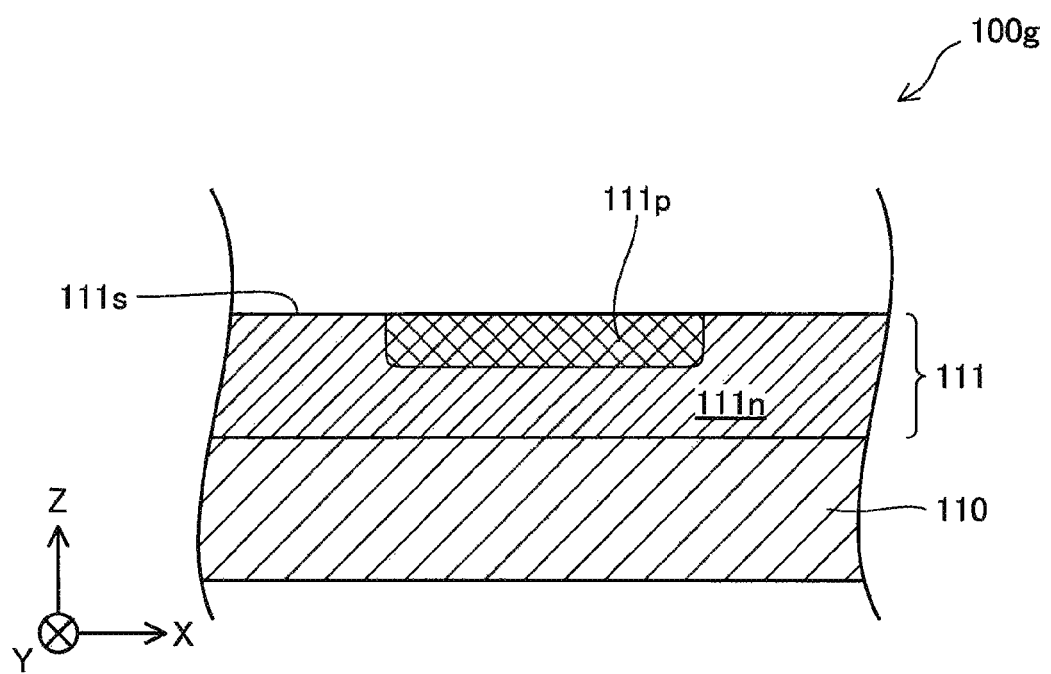
FIG. 8 is a diagram schematically illustrating a process of manufacturing the semiconductor device.

After completion of the heating process (process P160), the manufacturer performs a removal process (process P170, FIG. 8). In the removal process (process P170), the manufacturer removes the through film 810 from the semiconductor layer 111. The manufacturer accordingly obtains a semiconductor device 100g including the n-type semiconductor region 111n and the p-type semiconductor region 111p as a half-finished semiconductor device in the course of manufacture. The p-type semiconductor region 111p is mainly made of a group III nitride, contains the p-type impurity, is adjacent to the n-type semiconductor region 111n and has a surface 111s continuously spread to the n-type semiconductor region 111n.

According to this embodiment, in the removal process (process P170), the manufacturer uses a stripping solution having pH of not lower than 12 to remove the through film 810 from the semiconductor layer 111. This enables the through film 810 to be readily removed from the semiconductor layer 111.

According to this embodiment, in the removal process (process P170), the manufacturer uses a stripping solution of between 50° C. and 120° C. inclusive to remove the through film 810 from the semiconductor layer 111. This enables the through film 810 to be readily removed from the semiconductor layer 111.

According to this embodiment, in the removal process (process P170), the manufacturer soaks the semiconductor device 100f in the stripping solution for a treatment time of between 1 minute and 60 minutes inclusive to remove the through film 810 from the semiconductor layer 111. This enables the through film 810 to be sufficiently removed from the semiconductor layer 111.

After completion of the removal process (process P170), formation of at least one of another semiconductor layer, a trench, a recess, an insulating film and electrodes on the semiconductor device 100g completes a semiconductor device.

A-2. Evaluation Test

The examiner manufactured the semiconductor device 100g according to an embodiment by the manufacturing method of the embodiment described above and manufactured a semiconductor device according to a comparative example by a manufacturing method different from that of the above embodiment. The manufacturing method of the comparative example is similar to the manufacturing method of the embodiment described above except formation of a through film mainly made of silicon dioxide ($SiO_2$) in place of the through film 810 mainly made of the amorphous component of aluminum nitride (AlN) and removal of the through film after the ion implantation process but before the heating process.

The examiner performed CV (capacitance-voltage) measurement for the p-type semiconductor region 111*p* of the embodiment. The result of the CV measurement showed the acceptor concentration of about $10^{15}$ to $10^{17}$ $cm^{-3}$ in the p-type semiconductor region 111*p*. This indicates that the p-type semiconductor region 111*p* has the sufficient p-type characteristics.

The examiner also performed CV measurement for a region of ion implantation in the comparative example, similarly to the embodiment. The result of the CV measurement did not show the p-type characteristics.

The examiner analyzed the surface 111*s* of the p-type semiconductor region 111*p* of the embodiment by electron microscopy. The result of electron microscopy showed that no droplets of about 10 to 30 nm in diameter were observed on the surface 111*s* of the p-type semiconductor region 111*p*. This indicates the good surface morphology of the surface 111*s*.

The examiner also analyzed the surface of the region of ion implantation according to the comparative example by electron microscopy, similarly to the embodiment. The result of electron microscopy showed that droplets of about 10 to 30 nm in diameter were observed on the surface of the region of ion implantation. This indicates the poor surface morphology.

Figure 9:
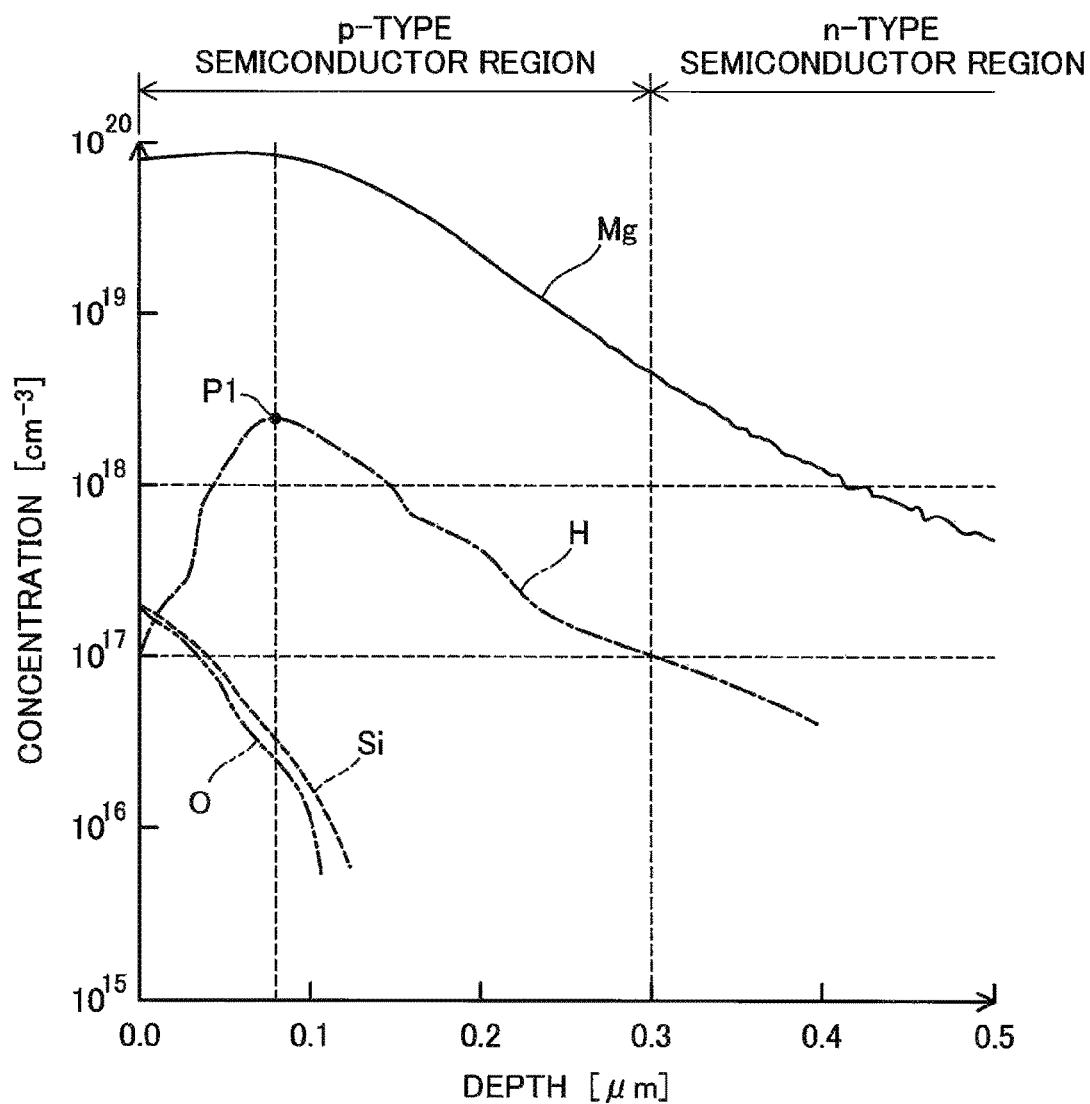
FIG. 9 is a graph showing concentration distributions of impurity atoms in semiconductor regions according to an embodiment.

FIG. 9 is a graph showing concentration distributions of impurity atoms in semiconductor regions of the embodiment. The abscissa of FIG. 9 shows the depth in the −Z-axis direction (depth direction) from the surface 111*s* of the p-type semiconductor region 111*p* of the embodiment. The ordinate of FIG. 9 shows the concentrations of impurity atoms. The examiner obtained the results of analysis shown in FIG. 9 by secondary ion mass spectrometry (SIMS) for the p-type semiconductor region 111*p* of the embodiment.

In the embodiment, the concentration of oxygen atom (O) included in the p-type semiconductor region 111*p* is lower than $1 \times 10^{18}$ $cm^{-3}$ and gradually decreases with an increase in depth from the surface 111*s*. The concentration of silicon atom (Si) included in the p-type semiconductor region 111*p* is also lower than $1 \times 10^{18}$ $cm^{-3}$ and gradually decreases with an increase in depth from the surface 111*s*. In the semiconductor layer 111, the oxygen atom (O) and the silicon atom (Si) serve as the n-type impurity.

In the embodiment, the concentration of hydrogen atom (H) included in the p-type semiconductor region 111*p* gradually increases and then gradually decreases with an increase in depth from the surface 111*s*. The concentration of hydrogen atom (H) in the p-type semiconductor region 111*p* is not lower than $1 \times 10^{17}$ $cm^{-3}$.

In the embodiment, the concentration of magnesium atom (Mg) included in the p-type semiconductor region 111*p* starts gradually decreasing at a location P1 where the concentration of hydrogen atom (H) starts gradually decreasing, with an increase in depth from the surface 111*s*. In the semiconductor layer 111, the magnesium atom (Mg) serves as the p-type impurity. The concentration of magnesium atom (Mg) in the n-type semiconductor region 111*p* is not lower than $1 \times 10^{18}$ $cm^{-3}$.

Figure 10:
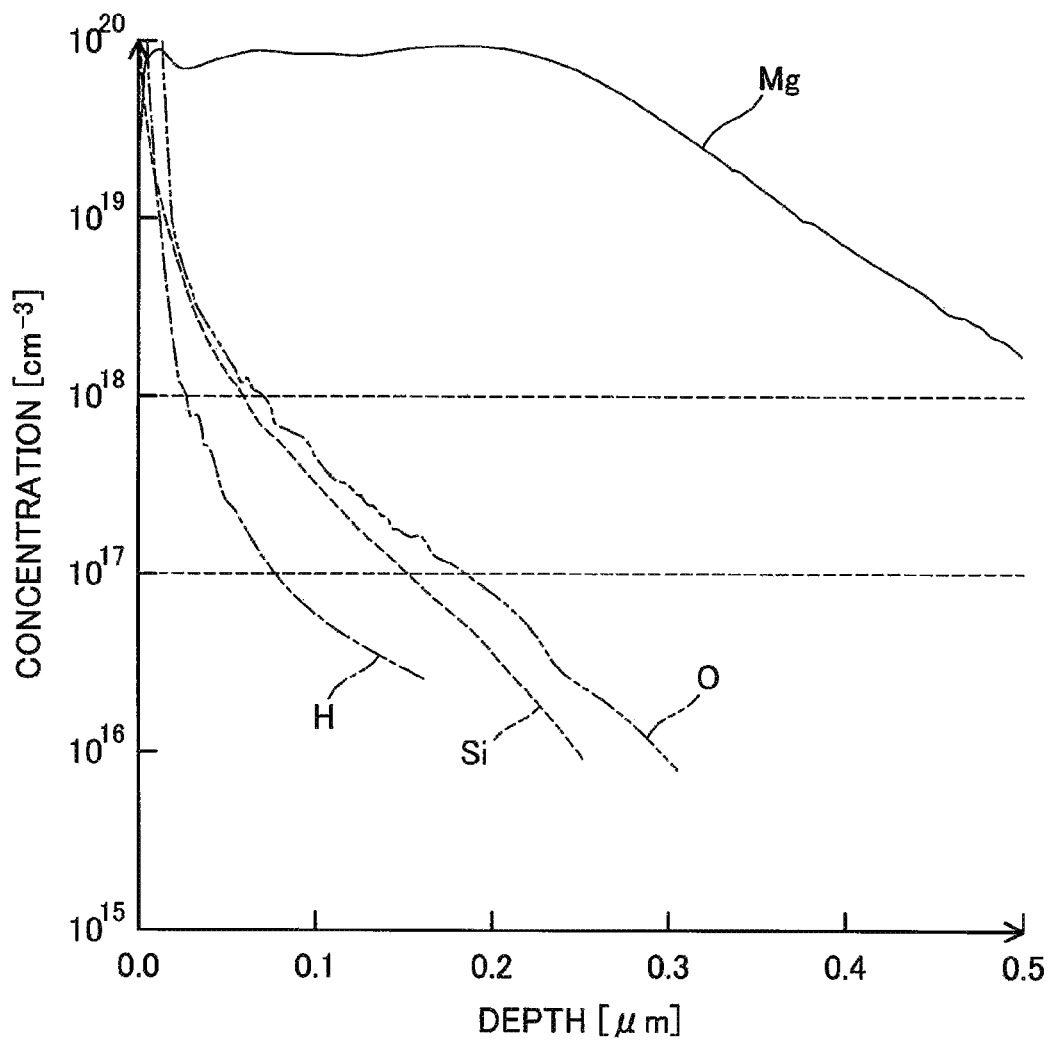
FIG. 10 is a graph showing concentration distributions of impurity atoms in a semiconductor region according to a comparative example.

FIG. 10 is a graph showing concentration distributions of impurity atoms in a semiconductor region of the comparative example. The abscissa of FIG. 10 shows the depth in the −Z-axis direction (depth direction) from the surface of the region of ion implantation according to the comparative example. The ordinate of FIG. 10 shows the concentrations of impurity atoms. The examiner obtained the result of analysis shown in FIG. 10 by secondary ion mass spectrometry (SIMS) for the region of ion implantation according to the comparative example.

In the comparative example, the concentration of oxygen atom (O) included in the region of ion implantation is not lower than $1 \times 10^{17}$ $cm^{-3}$ up to the depth of about 0.2 μm (micrometer) and gradually decreases with an increase in depth from the surface of the semiconductor layer. The concentration of silicon atom (Si) included in the region of ion implantation is also not lower than $1 \times 10^{17}$ $cm^{-3}$ up to the depth of about 0.2 μm (micrometer) and gradually decreases with an increase in depth from the surface of the semiconductor layer.

In the comparative example, the concentration of hydrogen atom (H) included in the region of ion implantation is not lower than $1 \times 10^{17}$ $cm^{-3}$ up to the depth of about 0.1 μm and gradually decreases with an increase in depth from the surface of the semiconductor layer.

In the comparative example, the concentration of magnesium atom (Mg) included in the region of ion implantation gradually decreases with an increase in depth from the location of about 0.2 μm in depth and is not lower than $1 \times 10^{18}$ $cm^{-3}$ up to the depth of about 0.5 μm.

Figure 11:
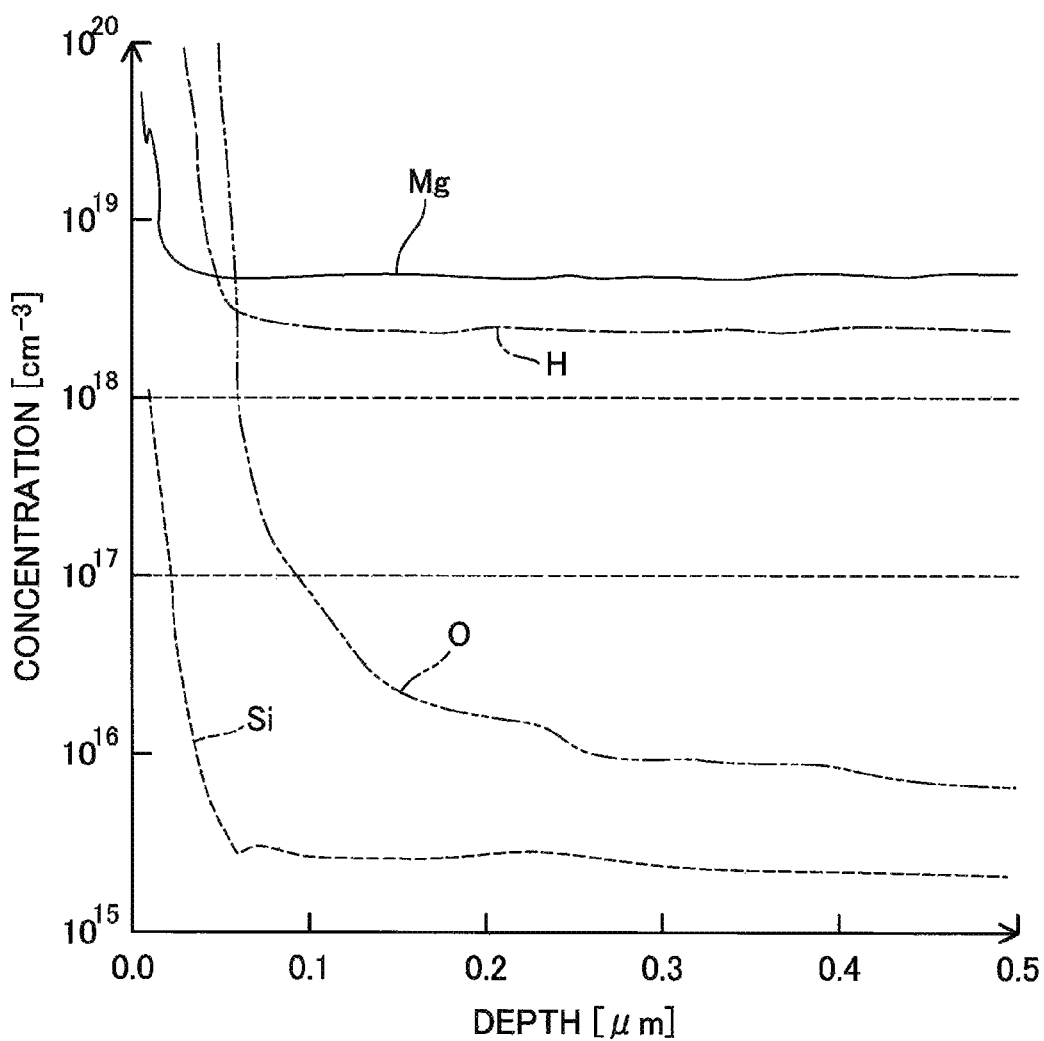
FIG. 11 is a graph showing concentration distributions of impurity atoms in a p-type semiconductor region by epitaxial growth.

FIG. 11 is a graph showing concentration distributions of impurity atoms in a p-type semiconductor region by epitaxial growth. The abscissa of FIG. 11 shows the depth from the surface in the p-type semiconductor region by epitaxial growth. The ordinate of FIG. 11 shows the concentrations of impurity atoms. The examiner obtains the results of analysis shown in FIG. 11 by secondary ion mass spectrometry (SIMS) for the p-type semiconductor region by epitaxial growth.

In the p-type semiconductor region by epitaxial growth, the concentration of magnesium atom (Mg) is substantially constant at about $5 \times 10^{18}$ $cm^{-3}$ irrespective of a variation in depth, and the concentration of hydrogen atom (H) is substantially constant at about $2 \times 10^{18}$ $cm^{-3}$ irrespective of a variation in depth. In the p-type semiconductor region by epitaxial growth, the concentrations of oxygen atom (O) and silicon atom (Si) respectively become equal to or lower than $1 \times 10^{17}$ $cm^{-3}$ by the depth of about 0.1 μm.

Figure 12:
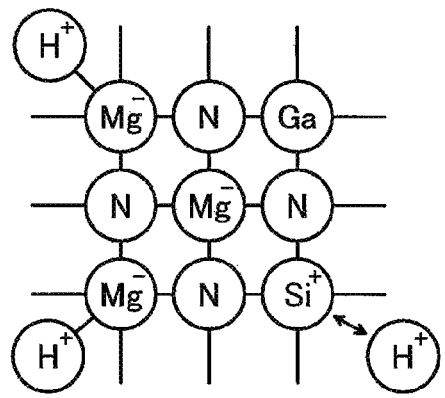
FIG. 12 is a diagram schematically illustrating the state of atoms in a p-type semiconductor region according to an embodiment.

FIG. 12 is a diagram schematically illustrating the state of atoms in the p-type semiconductor region 111*p* of the embodiment. The embodiment has the less amount of the n-type impurity such as oxygen atom (O) and silicon atom (Si) included in gallium nitride (GaN) of the semiconductor layer 111, compared with the comparative example. The ion-implanted magnesium atom (Mg) is thus more likely to enter the lattice points of gallium atom (Ga) in the heating process, compared with the comparative example. The magnesium atom (Mg) entering the lattice points of gallium atom (Ga) is ionized as magnesium ion (Mg). The magnesium ion ($Mg^-$) attracts hydrogen ion ($H^+$). This is likely to cause an increase in the concentration of hydrogen atom (H) in the p-type semiconductor region 111*p*.

Figure 13:
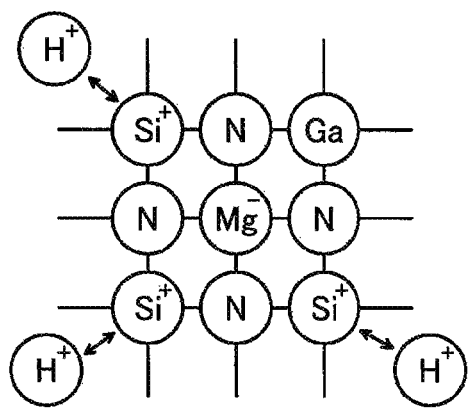
FIG. 13 is a diagram schematically illustrating the state of atoms in a region of ion implantation according to a comparative example.

FIG. 13 is a diagram schematically illustrating the state of atoms in the region of ion implantation according to the comparative example. The comparative example has the greater amount of the n-type impurity such as oxygen atom (O) and silicon atom (Si) on the surface of gallium nitride (GaN) of the semiconductor layer, compared with the embodiment. The n-type impurity is accordingly knocked-on in the surface layer of gallium nitride (GaN) in the ion implantation process. In the subsequent heating process, the n-type impurity such as oxygen atom (O) and silicon atom (Si) enters the lattice points of gallium atom (Ga), so that the ion-implanted magnesium atom (Mg) is expected to deposit in the form of droplets. The silicon ion ($Si^+$) entering the lattice points of gallium atom (Ga) produces repulsive force against hydrogen ion ($H^+$). This is unlikely to cause an increase in the concentration of hydrogen atom (H) that is observed in the embodiment.

A-3. Advantageous Effects

In the first embodiment described above, the through film 810 serves to suppress adhesion of the n-type impurity on the surface 111s of the semiconductor layer 111 and accordingly suppresses the n-type impurity adhering to the surface 111s of the semiconductor layer 111 from being knocked-on and diffused in the semiconductor layer 111 in the ion implantation process (process P140). This accelerates diffusion of the p-type impurity into the semiconductor layer 111 and accordingly suppresses deposition of the p-type impurity on the surface 111s of the semiconductor layer 111. This improves the surface morphology of the p-type semiconductor region 111p formed by ion implantation. This results in improving the device characteristics of the semiconductor device.

B. Second Embodiment

Figure 14:
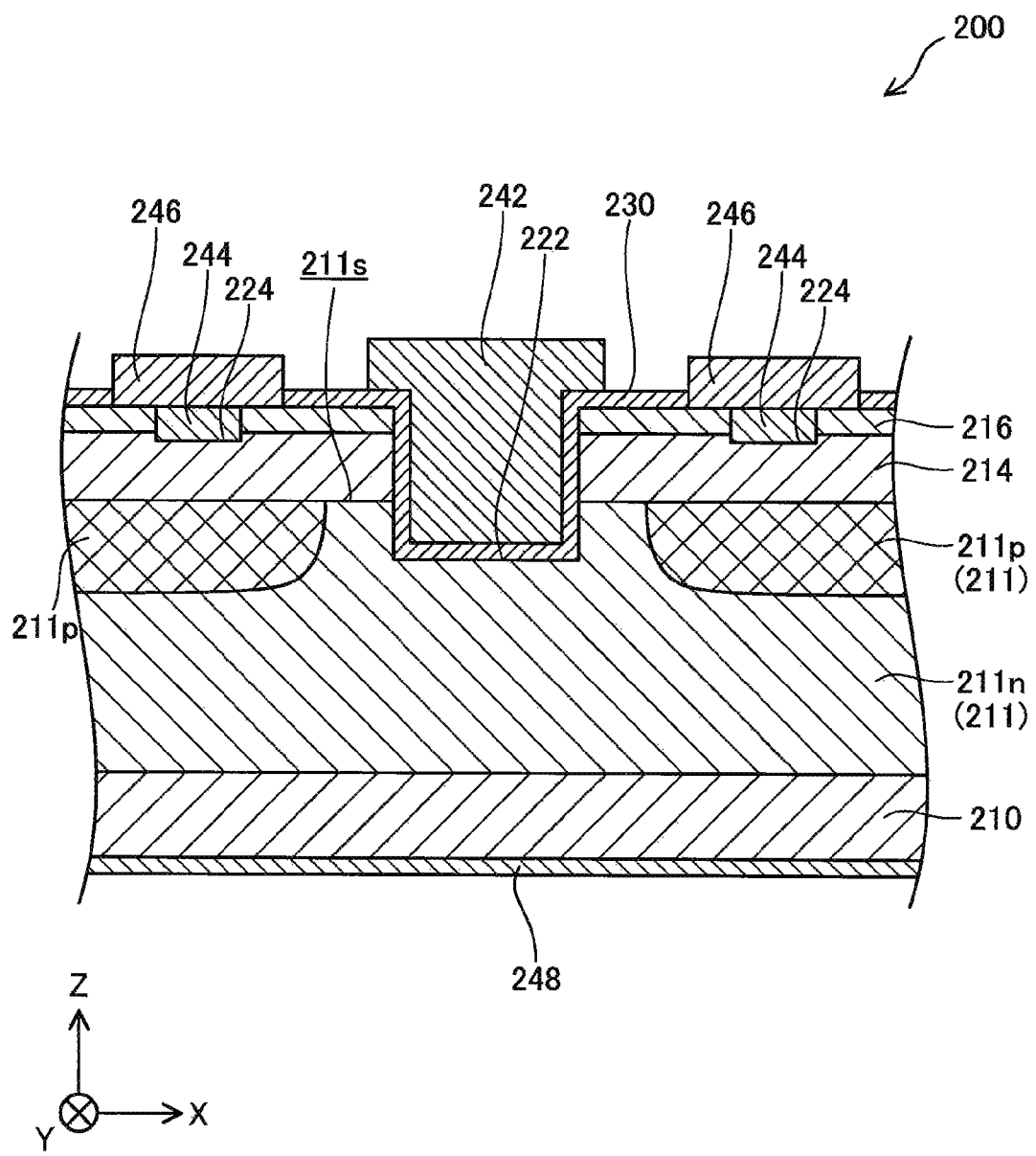
FIG. 14 is a sectional view schematically illustrating the configuration of a semiconductor device according to a second embodiment.

FIG. 14 is a sectional view schematically illustrating the configuration of a semiconductor device 200 according to a second embodiment. XYZ axes orthogonal to one another are illustrated in FIG. 14, similarly to FIG. 2.

According to this embodiment, the semiconductor device 200 is a GaN-based semiconductor device formed using gallium nitride (GaN). According to this embodiment, the semiconductor device 200 is a vertical trench MOSFET (metal-oxide-semiconductor field-effect transistor). According to this embodiment, the semiconductor device 200 is used for power control and is also called power device.

The semiconductor device 200 includes a substrate 210, a semiconductor layer 211, a p-type semiconductor layer 214 and an n-type semiconductor layer 216. The semiconductor layer 211 includes an n-type semiconductor region 211n and a p-type semiconductor region 211p. The semiconductor device 200 has a trench 222 and recesses 224 as the structures formed in these semiconductor layers. The semiconductor device 200 also includes an insulating film 230, a gate electrode 242, body electrodes 244, source electrodes 246 and a drain electrode 248.

The substrate 210 of the semiconductor device 200 is similar to the substrate 110 of the first embodiment. The semiconductor layer 211 of the semiconductor device 200 is similar to the semiconductor layer 111 of the first embodiment. The semiconductor layer 211 may have thickness (length in the Z-axis direction) of between 10 µm and 20 µm inclusive and has thickness of about 10 µm according to this embodiment. The n-type semiconductor region 211n of the semiconductor layer 211 is similar to the n-type semiconductor region 111n of the first embodiment. The p-type semiconductor region 211p of the semiconductor layer 211 is similar to the p-type semiconductor region 111p of the first embodiment. The p-type semiconductor region 211p is adjacent to the n-type semiconductor region 211n and has a surface 211s continuously spread to the n-type semiconductor region 211n. The p-type semiconductor region 211p is formed in a location away from the trench 222.

The p-type semiconductor layer 214 of the semiconductor device 200 is a semiconductor having p-type characteristics. According to this embodiment, the p-type semiconductor layer 214 is located on the +Z-axis direction side of the semiconductor layer 211 and is extended along the X axis and the Y axis. According to this embodiment, the p-type semiconductor layer 214 is mainly made of gallium nitride (GaN). According to this embodiment, the p-type semiconductor layer 214 contains magnesium (Mg) as the acceptor element. According to this embodiment, the average concentration of magnesium (Mg) contained in the p-type semiconductor layer 214 is about $2 \times 10^{18}$ $cm^{-3}$. The p-type semiconductor layer 214 may have thickness (length in the Z-axis direction) of between 0.5 µm and 1.0 µm inclusive and has thickness of about 0.7 µm according to this embodiment.

The n-type semiconductor layer 216 of the semiconductor device 200 is a semiconductor having n-type characteristics. According to this embodiment, the n-type semiconductor layer 216 is located on the +Z-axis direction side of the p-type semiconductor layer 214 and is extended along the X axis and the Y axis. According to this embodiment, the n-type semiconductor layer 216 is mainly made of gallium nitride (GaN). According to this embodiment, the n-type semiconductor layer 216 contains silicon (Si) as the donor element. The average concentration of silicon (Si) contained in the n-type semiconductor layer 216 is about $3 \times 10^{18}$ $cm^{-3}$. According to this embodiment, the n-type semiconductor layer 216 has thickness (length in the Z-axis direction) of about 0.4 µm.

The trench 222 of the semiconductor device 200 is a groove recessed from the +Z-axis direction side of the n-type semiconductor layer 216 through the p-type semiconductor layer 214 into the n-type semiconductor region 211n of the semiconductor layer 211. According to this embodiment, the trench 222 is a structure formed by dry etching in the respective semiconductor layers.

The recess 224 of the semiconductor device 200 is a concave recessed from the +Z-axis direction side of the n-type semiconductor layer 216 into the p-type semiconductor layer 214. According to this embodiment, the recess 224 is a structure formed by dry etching in the respective semiconductor layers.

The insulating film 230 of the semiconductor device 200 is a film that is formed inside of the trench 222 and has electrical insulating properties. According to this embodiment, the insulating film 230 is formed from inside over to outside of the trench 222. According to this embodiment, the insulating film 230 is mainly made of silicon dioxide ($SiO_2$).

The gate electrode 242 of the semiconductor device 200 is an electrode formed inside of the trench 222 via the insulating film 230. According to this embodiment, the gate electrode 242 is formed from inside over to outside of the trench 222. According to this embodiment, the gate electrode 242 is mainly made of aluminum (Al). When a voltage is applied to the gate electrode 242, an inversion layer is formed in the p-type semiconductor layer 214 and serves as a channel, so that a conductive path is formed between the source electrode 246 and the drain electrode 248.

The body electrode 244 of the semiconductor device 200 is an electrode that is formed in the recess 224 and is in ohmic contact with the p-type semiconductor layer 214. According to this embodiment, the body electrode 244 is mainly made of palladium (Pd).

The source electrode 246 of the semiconductor device 200 is an electrode that is in ohmic contact with the n-type semiconductor layer 216. According to this embodiment, the source electrode 246 is formed on the body electrode 244 over to the +Z-axis direction side surface of the n-type semiconductor layer 216. According to another embodiment, the source electrode 246 may be formed at a location away from the body electrode 244. According to this embodiment, the source electrode 246 is an electrode obtained by stacking a layer mainly made of aluminum (Al) on a layer mainly made of titanium (Ti).

The drain electrode 248 of the semiconductor device 200 is an electrode that is in ohmic contact with the −Z-axis direction side surface of the substrate 210. According to this embodiment, the drain electrode 248 is an electrode obtained by stacking a layer mainly made of aluminum (Al) on a layer mainly made of titanium (Ti).

Figure 15:
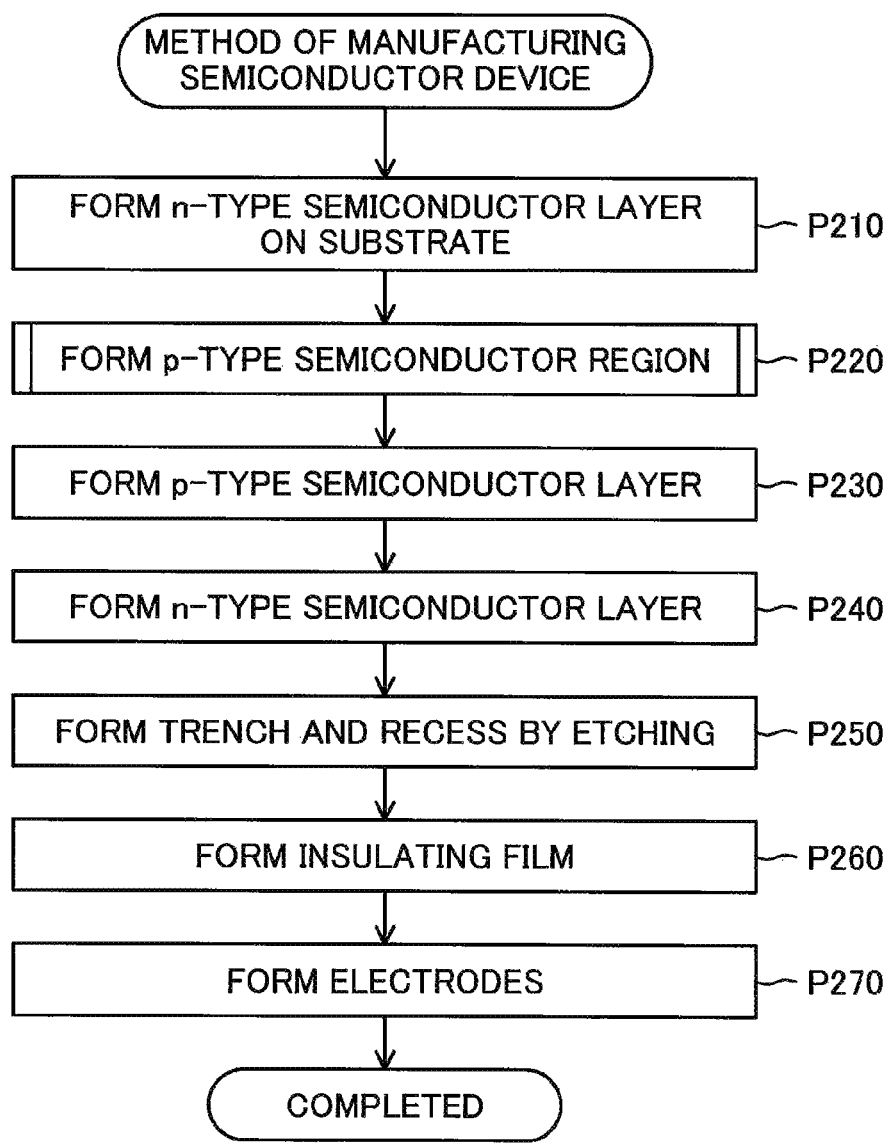
FIG. 15 is a process chart showing a method of manufacturing the semiconductor device according to the second embodiment.

FIG. 15 is a process chart showing a method of manufacturing the semiconductor device 200 according to the second embodiment. The manufacturer first forms the semiconductor layer 211 on the substrate 210 by crystal growth (process P210), like the first embodiment. The manufacturer subsequently forms the p-type semiconductor region 211p in the semiconductor layer 211 (process P220), like the series of the film formation process (process P120) to the removal process (process P170) of the first embodiment.

After forming the p-type semiconductor region 211p (process P220), the manufacturer forms the p-type semiconductor layer 214 on the semiconductor layer 211 (process P230). According to this embodiment, the manufacturer forms the p-type semiconductor layer 214 by metal organic chemical vapor deposition (MOCVD).

After forming the p-type semiconductor layer 214 (process P230), the manufacturer forms the n-type semiconductor layer 216 on the p-type semiconductor layer 214 (process P240). According to this embodiment, the manufacturer forms the n-type semiconductor layer 216 by metal organic chemical vapor deposition (MOCVD).

After forming the n-type semiconductor layer 216 (process P240), the manufacturer forms the trench 222 and the recess 224 by etching (process P250). According to this embodiment, the manufacturer forms the trench 222 and the recess 224 by dry etching.

After forming the trench 222 and the recess 224 (process P250), the manufacturer forms the insulating film 230 (process P260). According to this embodiment, the manufacturer forms the insulating film 230 by atomic layer deposition (ALD).

After forming the insulating film 230 (process P260), the manufacturer forms the gate electrode 242, the body electrode 244, the source electrode 246 and the drain electrode 248 (process P270). The semiconductor device 200 is completed through this series of processes.

The configuration of the second embodiment described above improves the surface morphology of the p-type semiconductor region 211p formed by ion implantation, like the first embodiment. This results in improving the device characteristics of the semiconductor device 200.

C. Third Embodiment

Figure 16:
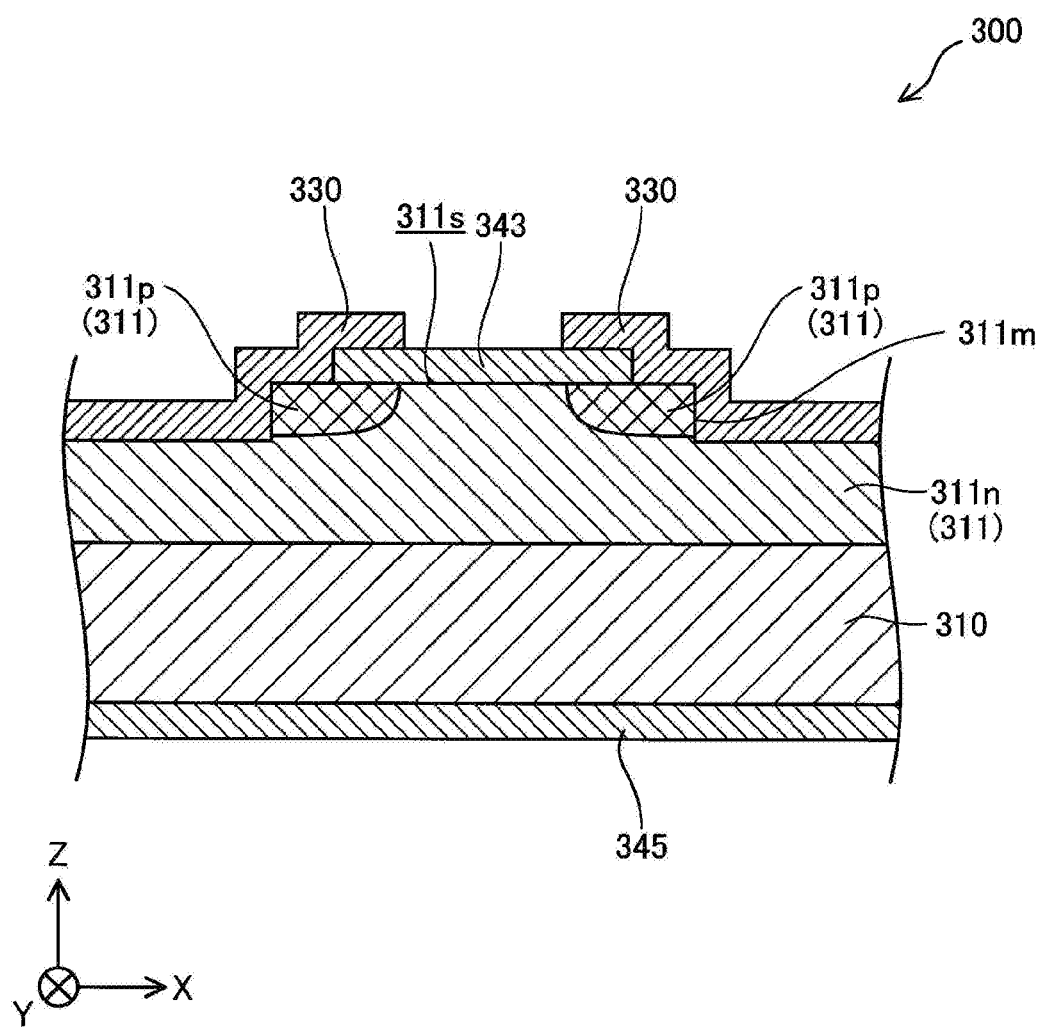
FIG. 16 is a sectional view schematically illustrating the configuration of a semiconductor device according to a third embodiment.

FIG. 16 is a sectional view schematically illustrating the configuration of a semiconductor device 300 according to a third embodiment. XYZ axes orthogonal to one another are illustrated in FIG. 16, similarly to FIG. 2.

According to this embodiment, the semiconductor device 300 is a GaN-based semiconductor device formed using gallium nitride (GaN). According to this embodiment, the semiconductor device 300 is a vertical Schottky barrier diode. According to this embodiment, the semiconductor device 300 is used for power control and is also called power device.

The semiconductor device 300 includes a substrate 310, a semiconductor layer 311, a Schottky electrode 343, an insulating film 330 and a rear-face electrode 345. The semiconductor device 300 has a mesa 311m as a structure formed in the semiconductor layer 311.

The substrate 310 of the semiconductor device 300 is similar to the substrate 110 of the first embodiment. The semiconductor layer 311 of the semiconductor device 300 is similar to the semiconductor layer 111 of the first embodiment. The semiconductor layer 311 may have thickness (length in the Z-axis direction) of between 10 µm and 20 µm inclusive and has thickness of about 10 µm at the location of the mesa 311m according to this embodiment. The semiconductor layer 311 includes an n-type semiconductor region 311n that is similar to the n-type semiconductor region 111n of the first embodiment. The semiconductor layer 311 also includes a p-type semiconductor region 311p that is similar to the p-type semiconductor region 111p of the first embodiment. The p-type semiconductor region 311p forms an end of the mesa 311m. The p-type semiconductor region 311p is adjacent to the n-type semiconductor region 311n and has a surface 311s spread over to the n-type semiconductor region 311n. The surface 311s forms a top face of the mesa 311m.

The Schottky electrode 343 of the semiconductor device 300 is an anode electrode that is made of an electrically conductive material and has Schottky junction with the surface 311s of the mesa 311m. According to this embodiment, the Schottky electrode 343 is mainly made of nickel (Ni). According to this embodiment, the Schottky electrode 343 is a metal layer formed by electron beam-induced deposition.

The insulating film 330 of the semiconductor device 300 is a film that has electrical insulating properties and is formed from the circumference of the mesa 311m over onto the Schottky electrode 343. According to this embodiment, the insulating film 330 is a film obtained by stacking a layer that is mainly made of silicon dioxide ($SiO_2$), has thickness of about 500 nm and is formed by plasma chemical vapor deposition (plasma CVD) on a layer that is mainly made of aluminum oxide ($Al_2O_3$), has thickness of about 100 nm and is formed by atomic layer deposition (ALD).

The rear-face electrode 345 of the semiconductor device 300 is a cathode electrode that is made of an electrically conductive material and is in ohmic contact with the −Z-axis direction side of the substrate 310. According to this embodiment, the rear-face electrode 345 is an electrode obtained by stacking a layer made of an aluminum silicon alloy (AlSi) on a layer mainly made of titanium (Ti) by sputtering.

Figure 17:
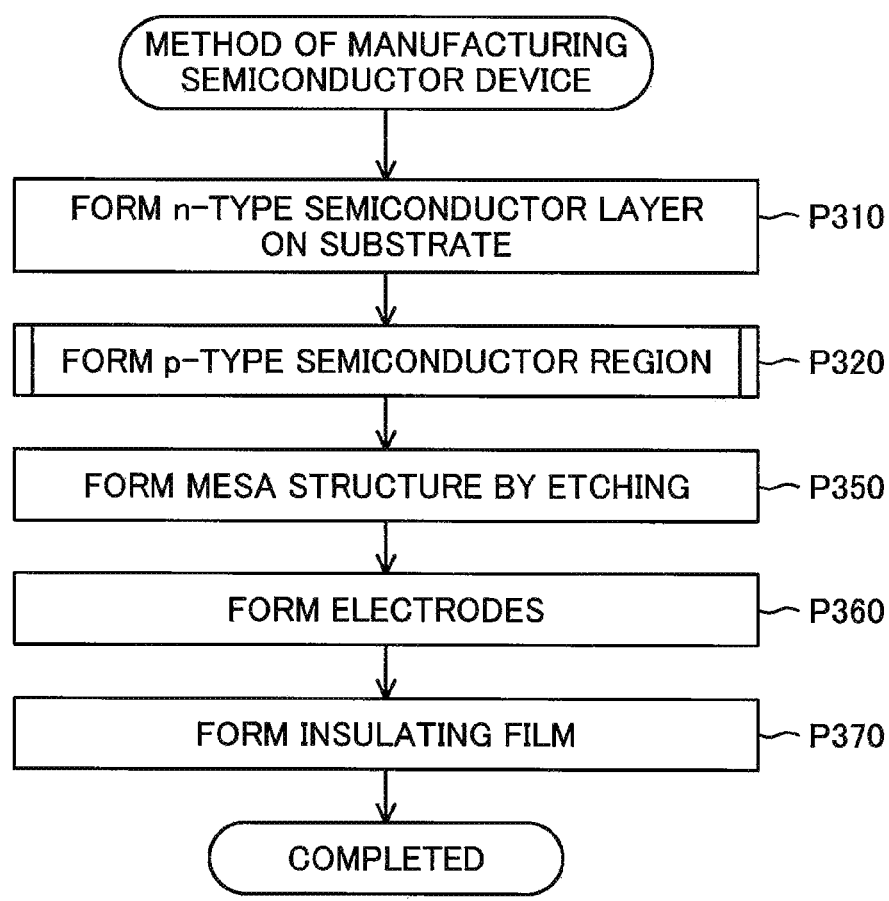
FIG. 17 is a process chart showing a method of manufacturing the semiconductor device according to the third embodiment.

FIG. 17 is a process chart showing a method of manufacturing the semiconductor device 300 according to the third embodiment. The manufacturer first forms the semiconductor layer 311 on the substrate 310 by crystal growth (process P310), like the first embodiment. The manufacturer subsequently forms the p-type semiconductor region 311p in the semiconductor layer 311 (process P320), like the series of the film formation process (process P120) to the removal process (process P170) of the first embodiment.

After forming the p-type semiconductor region 311p (process P320), the manufacturer forms the mesa 311m by etching (process P350). According to this embodiment, the manufacturer forms the mesa 311m by dry etching.

After forming the mesa 311m (process P350), the manufacturer forms the Schottky electrode 343 and the rear-face electrode 345 (process P360). The manufacturer then forms the insulating film 330 (process P370). The semiconductor device 300 is completed through this series of processes.

The configuration of the third embodiment described above improves the surface morphology of the p-type semiconductor region 311p formed by ion implantation, like the first embodiment. This results in improving the device characteristics of the semiconductor device 300.

D. Fourth Embodiment

Figure 18:
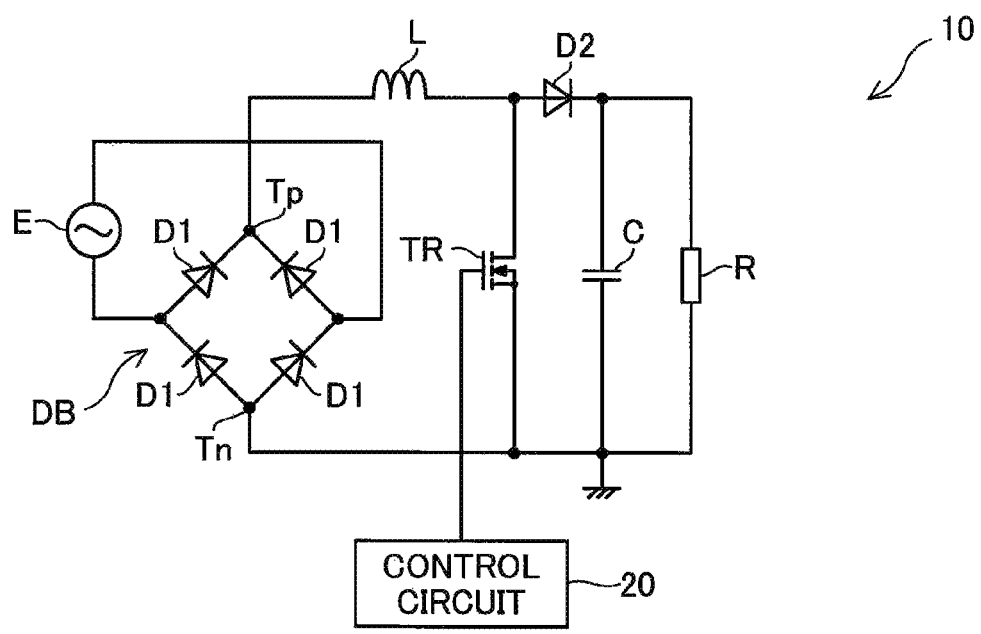
FIG. 18 is a diagram illustrating the configuration of a power converter.

FIG. 18 is a diagram illustrating the configuration of a power converter 10. The power converter 10 is an apparatus configured to convert electric power supplied from an AC power supply E to a load R. The power converter 10 includes a control circuit 20, a transistor TR, four diodes D1, a coil L, a diode D2 and a capacitor C as components of a power factor correction circuit to improve the power factor of the AC power supply E.

The diodes D1 and D2 of the power converter 10 have configuration similar to that of the semiconductor device 300 of the third embodiment. In the power converter 10, the four diodes D1 constitute a diode bridge DB configured to rectify an AC voltage of the AC power supply E. The diode bridge DB has a positive electrode output terminal Tp and a negative electrode output terminal Tn as terminals on the DC side. The coil L is connected with the positive electrode output terminal Tp of the diode bridge DB. The anode side of the diode D2 is connected with the positive electrode output terminal Tp via the coil L. The cathode side of the diode D2 is connected with the negative electrode output terminal Tn via the capacitor C. The load R is connected in parallel to the capacitor C.

The transistor TR of the power converter 10 is an FET (field-effect transistor) and has configuration similar to that of the semiconductor device 200 of the second embodiment. The source side of the transistor TR is connected with the negative electrode output terminal Tn. The drain side of the transistor TR is connected with the positive electrode output terminal Tp via the coil L. The gate side of the transistor TR is connected with the control circuit 20. The control circuit 20 of the power converter 10 controls the electric current between the source and the drain of the transistor TR, based on the voltage output to the load R and the electric current flowing in the diode bridge DB, in order to improve the power factor of the AC power supply E.

The configuration of the fourth embodiment described above improves the respective device characteristics of the diodes D1 and D2 and the transistor TR. This results in improving the power conversion efficiency of the power converter 10.

E. Other Embodiments

The invention is not limited to any of the embodiments, the examples and the modifications described above but may be implemented by a diversity of other configurations without departing from the scope of the invention. For example, the technical features of any of the embodiments, the examples and modifications corresponding to the technical features of each of the aspects described in SUMMARY may be replaced or combined appropriately, in order to solve part or all of the problems described above or in order to achieve part or all of the advantageous effects described above. Any of the technical features may be omitted appropriately unless the technical feature is described as essential herein.

The semiconductor device to which the present invention is applied is not limited to the vertical trench MOSFET described in the above embodiment but may be, for example, an insulated gate bipolar transistor (IGBT) or an MESFET (metal-semiconductor field effect transistor). The configuration of the invention may be applied to the terminal structure. The manufacturing method of the invention may be applied to manufacture of a structure having the n-type semiconductor layer and the p-type semiconductor layer replaced with each other.

In the embodiments described above, the material of the substrate is not limited to gallium nitride (GaN) but may be, for example, any of silicon (Si), sapphire ($Al_2O_3$) and silicon carbide (SiC). In the above embodiments, the material of the respective semiconductor layers is not limited to gallium nitride (GaN) but may be any nitride semiconductor containing gallium (Ga).

In the embodiments described above, the donor element contained in the n-type semiconductor layer is not limited to silicon (Si) but may be, for example, germanium (Ge) or oxygen (O).

In the embodiments described above, the acceptor element contained in the p-type semiconductor layer is not limited to magnesium (Mg) but may be, for example, zinc (Zn) or carbon (C).

In the embodiments described above, the material of the insulating film may be any material having electrical insulating properties and may be at least one selected from the group consisting of, for example, silicon nitride (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON), in addition to silicon dioxide ($SiO_2$). The insulating film may have a single-layer structure or may have a two-layer or multi-layer structure.

In the embodiments described above, the materials of the respective electrodes are not limited to the materials described in the embodiments but may be other materials.

What is claimed is:

1. A method of manufacturing a semiconductor device, the method comprising:
    forming a semiconductor layer that is mainly made of a group III nitride and has n-type characteristics, by crystal growth;
    forming a through film that is mainly made of an element different from an element serving as an n-type impurity of the group III nitride, by a growth on the semiconductor layer continuous with the crystal growth of the semiconductor layer;
    implanting a p-type impurity into the semiconductor layer across an exposed portion of an upper surface of the through film by an ion implantation;
    heating the semiconductor layer and the through film after a completion of the implanting, so as to activate a region of the semiconductor layer in which the p-type impurity is ion-implanted, to a p-type semiconductor region;
    removing the through film from the semiconductor layer, after a completion of the heating; and
    forming a protective film on the through film, after the completion of the implanting and prior to the heating.

2. The method of manufacturing the semiconductor device according to claim 1, wherein the through film is mainly made of at least one amorphous component selected from the group consisting of aluminum nitride (AlN), gallium nitride (GaN), indium nitride (MN), aluminum gallium nitride (AlGaN), gallium indium nitride (GaInN), aluminum indium nitride (AlInN), and aluminum gallium indium nitride (AlGaIaN).

3. The method of manufacturing the semiconductor device according to claim 1, wherein the forming the through film causes a growth of the through film at a temperature between 300° C. and 1500° C., inclusive.

4. The method of manufacturing the semiconductor device according to claim 1, wherein the forming the through film causes a growth of the through film under a pressure between 10 kPa and 100 kPa, inclusive.

5. The method of manufacturing the semiconductor device according to claim 1, wherein the implanting implants at least one of magnesium atom (Mg) and beryllium atom (Be) as the p-type impurity into the semiconductor layer across the through film by the ion implantation.

6. The method of manufacturing the semiconductor device according to claim 1, wherein the implanting implants the p-type impurity into the semiconductor layer across the through film by the ion implantation at a temperature between 20° C. and 500° C., inclusive.

7. The method of manufacturing the semiconductor device according to claim 1, wherein the heating heats the semiconductor layer and the through film at a temperature between 800° C. and 1500° C., inclusive.

8. The method of manufacturing the semiconductor device according to claim 1, wherein the heating heats the semiconductor layer and the through film under a pressure between 10 kPa and 100 kPa, inclusive.

9. The method of manufacturing the semiconductor device according to claim 1, wherein the through film is mainly made of a nitride of the element different from the element serving as the n-type impurity of the group III nitride, and wherein the heating heats the semiconductor layer and the through film in an atmosphere gas containing ammonia ($NH_3$).

10. The method of manufacturing the semiconductor device according to claim 1, wherein the heating heats the semiconductor layer and the through film for a treatment time of between 1 minute and 60 minutes, inclusive.

11. The method of manufacturing the semiconductor device according to claim 1, wherein the removing removes the through film from the semiconductor layer using a stripping solution having pH of not lower than 12.

12. The method of manufacturing the semiconductor device according to claim 1, wherein the removing removes the through film from the semiconductor layer using a stripping solution at a temperature between 50° C. and 120° C., inclusive.

13. The method of manufacturing the semiconductor device according to claim 1, wherein the removing soaks the semiconductor device in a stripping solution for a treatment time of between 1 minute and 60 minutes inclusive to remove the through film from the semiconductor layer.

14. The method of manufacturing the semiconductor device according to claim 1, wherein the through film comprises a single layer extending from an upper surface of the semiconductor layer to the exposed portion of the upper surface of the through film.

15. The method of manufacturing the semiconductor device according to claim 1, further comprising:
  prior to the implanting, forming a mask on the upper surface of the through film, the mask comprising an opening that exposes the exposed portion of the upper surface of the through film for the ion implantation; and
  prior to the heating, removing an entirety of the mask from the upper surface of the through film.

* * * * *